US008004255B2

(12) United States Patent
Lumsden

(10) Patent No.: US 8,004,255 B2
(45) Date of Patent: Aug. 23, 2011

(54) POWER SUPPLY FOR IGBT/FET DRIVERS

(75) Inventor: John L. Lumsden, Boca Raton, FL (US)

(73) Assignee: The Powerwise Group, Inc., Boca Raton, FL (US)

( * ) Notice: Subject to any disclaimer, the term of this patent is extended or adjusted under 35 U.S.C. 154(b) by 555 days.

(21) Appl. No.: 12/187,805

(22) Filed: Aug. 7, 2008

(65) Prior Publication Data
US 2010/0033155 A1 Feb. 11, 2010

(51) Int. Cl.
*G05F 1/40* (2006.01)
(52) U.S. Cl. ........................................................ 323/268
(58) Field of Classification Search .................. 323/268, 323/271, 272, 364, 369, 370
See application file for complete search history.

(56) References Cited

U.S. PATENT DOCUMENTS

| | | |
|---|---|---|
| 3,582,774 A | 6/1971 | Forgacs |
| 3,718,846 A | 2/1973 | Bejach |
| 3,753,472 A | 8/1973 | Dybwad et al. |
| 3,959,719 A | 5/1976 | Espelage |
| 3,976,987 A | 8/1976 | Anger |
| 4,096,436 A | 6/1978 | Cook et al. |
| 4,168,491 A | 9/1979 | Phillips et al. |
| 4,346,339 A | 8/1982 | Lewandowski |
| 4,353,025 A | 10/1982 | Dobkin |
| 4,429,269 A | 1/1984 | Brown |
| 4,456,871 A | 6/1984 | Stich |
| 4,513,240 A | 4/1985 | Putman |
| 4,513,274 A | 4/1985 | Halder |
| 4,616,174 A | 10/1986 | Jorgensen |
| 4,659,981 A | 4/1987 | Lumsden |
| 4,679,133 A | 7/1987 | Moscovici |
| 4,689,548 A | 8/1987 | Mechlenburg |
| 4,706,017 A | 11/1987 | Wilson |
| 4,819,180 A | 4/1989 | Hedman et al. |
| 4,859,926 A | 8/1989 | Wolze |
| 4,876,468 A | 10/1989 | Libert |
| 5,003,192 A | 3/1991 | Beigel |

(Continued)

FOREIGN PATENT DOCUMENTS
EP 1650860 B1 8/2008

OTHER PUBLICATIONS

International Search Report for International Application No. PCT/US2008/009482, dated Nov. 6, 2008 (2 pages).

(Continued)

*Primary Examiner* — Matthew Nguyen
(74) *Attorney, Agent, or Firm* — Strasburger & Price, LLP

(57) ABSTRACT

A power supply for IGBT/FET drivers (1) that provides separated, isolated power to each IGBT/FET driver in a system wherein the power supply (1) is connected to at least one voltage controller (16) having at least one line in main power connector (14), at least one line out main power connector (15) and at least one drive signal command input (11) for connection to at least one IGBT/FET driver. The power supply (1) includes at least one power supply unit (5) in connection with at least voltage controller (16), at least one diode (2) for routing a predetermined amount of power from the at least one voltage controller (16) to at least one capacitor (3) and at least one capacitor (3) for routing said predetermined amount of power from said at least one diode (2) to said at least one voltage controller (16).

20 Claims, 1 Drawing Sheet

U.S. PATENT DOCUMENTS

| | | |
|---|---|---|
| 5,066,896 A | 11/1991 | Bertenshaw et al. |
| 5,134,356 A | 7/1992 | El-Sharkawi et al. |
| 5,136,216 A | 8/1992 | Wills et al. |
| 5,180,970 A | 1/1993 | Ross |
| 5,202,621 A | 4/1993 | Reischer |
| 5,214,621 A | 5/1993 | Maggelet et al. |
| 5,227,735 A | 7/1993 | Lumsden |
| 5,239,255 A | 8/1993 | Schanin et al. |
| 5,259,034 A | 11/1993 | Lumsden |
| 5,299,266 A | 3/1994 | Lumsden |
| 5,332,965 A | 7/1994 | Wolf et al. |
| 5,350,988 A | 9/1994 | Le |
| 5,442,335 A | 8/1995 | Cantin et al. |
| 5,481,140 A | 1/1996 | Maruyama et al. |
| 5,481,225 A | 1/1996 | Lumsden et al. |
| 5,506,484 A | 4/1996 | Munro et al. |
| 5,543,667 A | 8/1996 | Shavit et al. |
| 5,559,685 A | 9/1996 | Lauw et al. |
| 5,600,549 A | 2/1997 | Cross |
| 5,614,811 A | 3/1997 | Sagalovich et al. |
| 5,615,097 A | 3/1997 | Cross |
| 5,625,236 A | 4/1997 | Lefebvre et al. |
| 5,635,826 A | 6/1997 | Sugawara |
| 5,652,504 A | 7/1997 | Bangerter |
| 5,699,276 A | 12/1997 | Roos |
| 5,732,109 A | 3/1998 | Takahashi |
| 5,747,972 A | 5/1998 | Baretich et al. |
| 5,754,036 A | 5/1998 | Walker |
| 5,828,200 A | 10/1998 | Ligman et al. |
| 5,880,578 A | 3/1999 | Oliveira et al. |
| 5,909,138 A | 6/1999 | Stendahl |
| 5,936,855 A | 8/1999 | Salmon |
| 5,942,895 A | 8/1999 | Popovich et al. |
| 5,945,746 A | 8/1999 | Tracewell et al. |
| 5,946,203 A | 8/1999 | Jiang et al. |
| 5,994,898 A | 11/1999 | DiMarzio et al. |
| 6,005,367 A | 12/1999 | Rohde |
| 6,055,171 A | 4/2000 | Ishii et al. |
| 6,184,672 B1 | 2/2001 | Berkcan |
| 6,191,568 B1 | 2/2001 | Poletti |
| 6,198,312 B1 | 3/2001 | Floyd |
| 6,225,759 B1 | 5/2001 | Bogdan et al. |
| 6,265,881 B1 | 7/2001 | Meliopoulos et al. |
| 6,297,610 B1 | 10/2001 | Bauer et al. |
| 6,326,773 B1 | 12/2001 | Okuma et al. |
| 6,351,400 B1 | 2/2002 | Lumsden |
| 6,400,098 B1 | 6/2002 | Pun |
| 6,411,155 B2 | 6/2002 | Pezzani |
| 6,414,475 B1 | 7/2002 | Dames et al. |
| 6,426,632 B1 | 7/2002 | Clunn |
| 6,449,567 B1 | 9/2002 | Desai et al. |
| 6,459,606 B1 | 10/2002 | Jadric |
| 6,483,247 B2 | 11/2002 | Edwards et al. |
| 6,486,641 B2 | 11/2002 | Scoggins et al. |
| 6,489,742 B2 | 12/2002 | Lumsden |
| 6,490,872 B1 | 12/2002 | Beck et al. |
| 6,528,957 B1 | 3/2003 | Luchaco |
| 6,548,988 B2 | 4/2003 | Duff, Jr. |
| 6,548,989 B2 | 4/2003 | Duff, Jr. |
| 6,553,353 B1 | 4/2003 | Littlejohn |
| 6,618,031 B1 | 9/2003 | Bohn, Jr. et al. |
| 6,643,149 B2 | 11/2003 | Arnet et al. |
| 6,650,554 B2 | 11/2003 | Darshan |
| 6,657,404 B1 | 12/2003 | Clark et al. |
| 6,662,821 B2 | 12/2003 | Jacobsen et al. |
| 6,664,771 B2 | 12/2003 | Scoggins et al. |
| 6,678,176 B2 | 1/2004 | Lumsden |
| 6,690,594 B2 | 2/2004 | Amarillas et al. |
| 6,690,704 B2 | 2/2004 | Fallon et al. |
| 6,718,213 B1 | 4/2004 | Enberg |
| 6,724,043 B1 | 4/2004 | Ekkanath Madathil |
| 6,747,368 B2 | 6/2004 | Jarrett, Jr. |
| 6,774,610 B2 | 8/2004 | Orozco |
| 6,781,423 B1 | 8/2004 | Knoedgen |
| 6,801,022 B2 | 10/2004 | Fa |
| 6,831,422 B2 * | 12/2004 | Limmer .................. 315/209 R |
| 6,836,099 B1 | 12/2004 | Amarillas et al. |
| 6,849,834 B2 | 2/2005 | Smolenski et al. |
| 6,912,911 B2 | 7/2005 | Oh et al. |
| 6,952,355 B2 | 10/2005 | Riggio et al. |
| 6,963,195 B1 | 11/2005 | Berkcan |
| 6,963,773 B2 | 11/2005 | Waltman et al. |
| 7,010,363 B2 | 3/2006 | Donnelly et al. |
| 7,019,474 B2 * | 3/2006 | Rice et al. ................ 318/400.26 |
| 7,019,498 B2 | 3/2006 | Pippin et al. |
| 7,019,992 B1 | 3/2006 | Weber |
| 7,019,995 B2 | 3/2006 | Niemand et al. |
| 7,049,758 B2 | 5/2006 | Weyhrauch et al. |
| 7,049,976 B2 | 5/2006 | Hunt et al. |
| 7,061,189 B2 | 6/2006 | Newman, Jr. et al. |
| 7,062,361 B1 | 6/2006 | Lane |
| 7,068,184 B2 | 6/2006 | Yee et al. |
| 7,081,729 B2 | 7/2006 | Chang et al. |
| 7,091,559 B2 | 8/2006 | Fragapane et al. |
| 7,106,031 B2 | 9/2006 | Hayakawa et al. |
| 7,119,576 B1 | 10/2006 | Langhammer et al. |
| 7,123,491 B1 | 10/2006 | Kusumi |
| 7,136,724 B2 | 11/2006 | Enberg |
| 7,157,898 B2 | 1/2007 | Hastings et al. |
| 7,164,238 B2 | 1/2007 | Kazanov et al. |
| 7,188,260 B1 | 3/2007 | Shaffer et al. |
| 7,205,822 B2 | 4/2007 | Torres et al. |
| 7,211,982 B1 | 5/2007 | Chang et al. |
| 7,245,100 B2 | 7/2007 | Takahashi |
| 7,250,748 B2 | 7/2007 | Hastings et al. |
| 7,256,564 B2 | 8/2007 | MacKay |
| 7,259,546 B1 | 8/2007 | Hastings et al. |
| 7,263,450 B2 | 8/2007 | Hunter |
| 7,279,860 B2 | 10/2007 | MacKay |
| 7,288,911 B2 | 10/2007 | MacKay |
| 7,298,132 B2 | 11/2007 | Woolsey et al. |
| 7,298,133 B2 | 11/2007 | Hastings et al. |
| 7,301,308 B2 | 11/2007 | Aker et al. |
| 7,336,463 B2 | 2/2008 | Russell et al. |
| 7,336,514 B2 | 2/2008 | Amarillas et al. |
| 7,349,765 B2 | 3/2008 | Reaume et al. |
| 7,355,865 B2 | 4/2008 | Royak et al. |
| 7,358,724 B2 | 4/2008 | Taylor et al. |
| 7,378,821 B2 | 5/2008 | Simpson, III |
| 7,386,713 B2 | 6/2008 | Madter et al. |
| 7,394,397 B2 | 7/2008 | Nguyen et al. |
| 7,397,212 B2 | 7/2008 | Turner |
| 7,397,225 B2 | 7/2008 | Schulz |
| 7,412,185 B2 | 8/2008 | Hall et al. |
| 7,417,410 B2 | 8/2008 | Clark, III et al. |
| 7,417,420 B2 | 8/2008 | Shuey et al. |
| 7,436,233 B2 | 10/2008 | Yee et al. |
| 7,446,514 B1 | 11/2008 | Li et al. |
| 7,525,296 B2 | 4/2009 | Bilig et al. |
| 7,528,503 B2 | 5/2009 | Rognli et al. |
| 7,615,989 B2 | 11/2009 | Kojori |
| 7,622,910 B2 | 11/2009 | Kojori |
| 7,719,859 B2 * | 5/2010 | Nishikawa ................. 363/17 |
| 2001/0010032 A1 | 7/2001 | Ehlers et al. |
| 2003/0090362 A1 | 5/2003 | Hardwick |
| 2004/0153170 A1 | 8/2004 | Santacatterina et al. |
| 2004/0181698 A1 | 9/2004 | Williams |
| 2004/0239335 A1 | 12/2004 | McClelland et al. |
| 2005/0033951 A1 | 2/2005 | Madter et al. |
| 2005/0068013 A1 | 3/2005 | Scoggins |
| 2006/0076937 A1 | 4/2006 | Achart |
| 2006/0103365 A1 | 5/2006 | Ben-Yaacov |
| 2006/0276938 A1 | 12/2006 | Miller |
| 2007/0024250 A1 | 2/2007 | Simpson, III |
| 2007/0037567 A1 | 2/2007 | Ungless |
| 2007/0069668 A1 | 3/2007 | MacKay |
| 2007/0071047 A1 | 3/2007 | Huang et al. |
| 2007/0213776 A1 | 9/2007 | Brink |
| 2007/0244603 A1 | 10/2007 | Level |
| 2007/0279053 A1 | 12/2007 | Taylor et al. |
| 2007/0283175 A1 | 12/2007 | Marinkovic et al. |
| 2007/0300084 A1 | 12/2007 | Goodrum et al. |
| 2007/0300085 A1 | 12/2007 | Goodrum et al. |
| 2008/0005044 A1 | 1/2008 | Benya et al. |
| 2008/0043506 A1 | 2/2008 | Ozaki et al. |
| 2008/0049452 A1 | 2/2008 | Van Bodegraven |
| 2008/0104430 A1 | 5/2008 | Malone et al. |

| | | | |
|---|---|---|---|
| 2008/0116825 A1* | 5/2008 | Descarries et al. ........... 315/302 | |
| 2008/0121448 A1 | 5/2008 | Betz et al. | |
| 2008/0177678 A1 | 7/2008 | Di Martini et al. | |
| 2008/0221737 A1 | 9/2008 | Josephson et al. | |
| 2008/0272934 A1 | 11/2008 | Wang et al. | |
| 2008/0281473 A1 | 11/2008 | Pitt | |
| 2008/0290731 A1 | 11/2008 | Cassidy | |
| 2008/0291607 A1 | 11/2008 | Braunstein et al. | |
| 2009/0018706 A1 | 1/2009 | Wittner | |
| 2009/0045804 A1 | 2/2009 | Durling et al. | |
| 2009/0046490 A1 | 2/2009 | Lumsden | |
| 2009/0051344 A1 | 2/2009 | Lumsden | |
| 2009/0062970 A1 | 3/2009 | Forbes, Jr. et al. | |
| 2009/0063228 A1 | 3/2009 | Forbes, Jr. | |
| 2009/0083167 A1 | 3/2009 | Subbloie | |
| 2009/0085545 A1 | 4/2009 | Shen et al. | |
| 2009/0088907 A1 | 4/2009 | Lewis et al. | |
| 2009/0094173 A1 | 4/2009 | Smith et al. | |
| 2009/0105888 A1 | 4/2009 | Flohr et al. | |
| 2009/0154206 A1 | 6/2009 | Fouquet et al. | |
| 2009/0160267 A1 | 6/2009 | Kates | |
| 2009/0168475 A1* | 7/2009 | Hirosawa ........................ 363/84 | |
| 2009/0189581 A1 | 7/2009 | Lawson et al. | |
| 2009/0200981 A1 | 8/2009 | Lumsden | |

OTHER PUBLICATIONS

Written Opinion of the International Search Authority for International Application No. PCT/US2008/009482, dated Nov. 6, 2008 (11 pages).
International Search Report for International Application No. PCT/US2008/009483, dated Nov. 18, 2008 (2 pages).
Written Opinion of the International Search Authority for International Application No. PCT/US2008/009483, dated Nov. 18, 2008 (6 pages).
International Search Report for International Application No. PCT/US2008/009533, dated Oct. 6, 2008 (2 pages).
Written Opinion of the International Search Authority for International Application No. PCT/US2008/009533, dated Oct. 6, 2008 (5 pages).
International Search Report for International Application No. PCT/US2008/010720, dated Nov. 25, 2008 (2 pages).
Written Opinion of the International Search Authority for International Application No. PCT/US2008/010720, dated Nov. 25, 2008 (4 pages).
International Search Report for International Application No. PCT/US2008/009393, dated Oct. 6, 2008 (3 pages).
Written Opinion of the International Search Authority for International Application No. PCT/US2008/009393, dated Oct. 6, 2008 (13 pages).
Frick, Vincent, et al., "CMOS Microsystem for AC Current Measurement with Galvanic Isolation," IEEE Sensors Journal, vol. 3, No. 6, pp. 752-760, 2003 IEEE (9 pages).
International Preliminary Report on Patentability for International Application No. PCT/US2008/009533, dated Feb. 8, 2011 (6 pages).

* cited by examiner

POWER SUPPLY FOR IGBT/FET DRIVERS

BACKGROUND OF THE INVENTION

This invention relates to energy savings insulated gate bipolar transistor and/or field effect transistor (IGBT/FET) drivers, more particularly, a power supply for IGBT/FET drivers wherein each driver is provided with its own operational power.

Currently, there are a plurality of techniques and methods for providing power to IGBT/FET drivers. However, the currently used techniques and methods are overly complex as separate drivers, and accordingly separate power supplies, are required. Because of the overly complex nature of providing power to each individually isolated driver, the costs associated with manufacturing, and accordingly selling, same is increased. For example, when direct alternate current (AC) control is employed, up to eight separate, isolated power supplies are necessary, dependent upon the circuit topology utilized. As each power supply must be regulated, the greater number of power supplies utilized, the greater the resulting cost.

In the alternative, single power supplies may be used wherein the power supply includes a multiplicity of isolated outputs. Once again, however, each output must be regulated, thereby increasing cost.

Therefore, there exists a need for a power supply for IGBT/FET drivers wherein each driver is provided with its own operational power.

The relevant prior art includes the following references:

| Patent/Ser. No. (U.S. unless stated otherwise) | Inventor | Issue/Publication Date |
| --- | --- | --- |
| 5,615,097 | Cross | Mar. 25, 1997 |
| 7,019,992 | Weber | Mar. 28, 2006 |
| 2006/0076937 | Achart | Apr. 13, 2006 |
| 2007/0213776 | Brink | Sep. 13, 2007 |
| 2008/0043506 | Ozaki et al. | Feb. 21, 2008 |
| 7,019,474 | Rice et al. | Mar. 28, 2006 |
| 6,963,773 | Waltman et al. | Nov. 08, 2005 |
| 5,909,138 | Stendahl | Jun. 01, 1999 |
| 6,952,355 | Riggio et al. | Oct. 04, 2005 |
| 6,690,704 | Fallon et al. | Feb. 10, 2004 |
| 2007/0071047 | Huang et al. | Mar. 29, 2007 |

SUMMARY OF THE INVENTION

The primary object of the present invention is to provide an isolated power supply for each IGBT/FET driver.

Another object of the present invention is to provide a power supply for IGBT/FET drivers having galvanic isolation of control electronics from a power section.

Another object of the present invention is to provide a power supply for IGBT/FET drivers that does not require large or expensive components.

An even further object of the present invention is to provide a power supply for IGBT/FET drivers that is low cost.

Another object of the present invention is to provide a power supply for IGBT/FET drivers that is reliable.

An even further object of the present invention is to provide a power supply for IGBT/FET drivers that is low maintenance.

Another object of the present invention is to provide a power supply for IGBT/FET drivers that is adaptable to any range of alternating current (AC) or direct current (DC) power control.

Another object of the present invention is to provide a power supply for IGBT/FET drivers that utilizes existing pulse width modulation techniques.

Another object of the present invention is to provide a power supply for IGBT/FET drivers that spreads power utilization across a complete sine wave.

Another object of the present invention is to provide a power supply for IGBT/FET drivers that may be used on 50/60/400 AC control.

Another object of the present invention is to provide a power supply for IGBT/FET drivers that may be used in variable frequency motor drives.

A further object of the present invention is to provide a power supply for IGBT/FET drivers that may be used in power inverters.

An even further object of the present invention is to provide a power supply for IGBT/FET drivers that may be used in AC power controllers, AC motor controllers, AC voltage inverters, AC voltage controllers and/or AC voltage regulators.

Another object of the present invention is to provide a power supply for IGBT/FET drivers that may be used in single-phase, bi-phase and/or poly-phase whole house energy savings devices.

An even further object of the present invention is to provide a power supply for IGBT/FET drivers that may be used in commercial and industrial energy savings devices.

The present invention fulfills the above and other objects by providing a power supply for IGBT/FET drivers that provides separated, isolated power to each IGBT/FET driver in a system wherein the power supply is connected to at least one voltage controller having at least one line in main power connector, at least one line out main power connector and at least one drive signal command input for connection to at least one IGBT/FET driver. The power supply includes at least one power supply unit in connection with at least voltage controller, at least one diode for routing a predetermined amount of power from the at least one voltage controller to at least one capacitor and at least one capacitor for routing said predetermined amount of power from said at least one diode to said at least one voltage controller.

The above and other objects, features and advantages of the present invention should become even more readily apparent to those skilled in the art upon a reading of the following detailed description in conjunction with the drawings wherein there is shown and described illustrative embodiments of the invention.

BRIEF DESCRIPTION OF THE DRAWINGS

In the following detailed description, reference will be made to the attached drawings in which.

DESCRIPTION OF THE PREFERRED EMBODIMENTS

Figure 1:
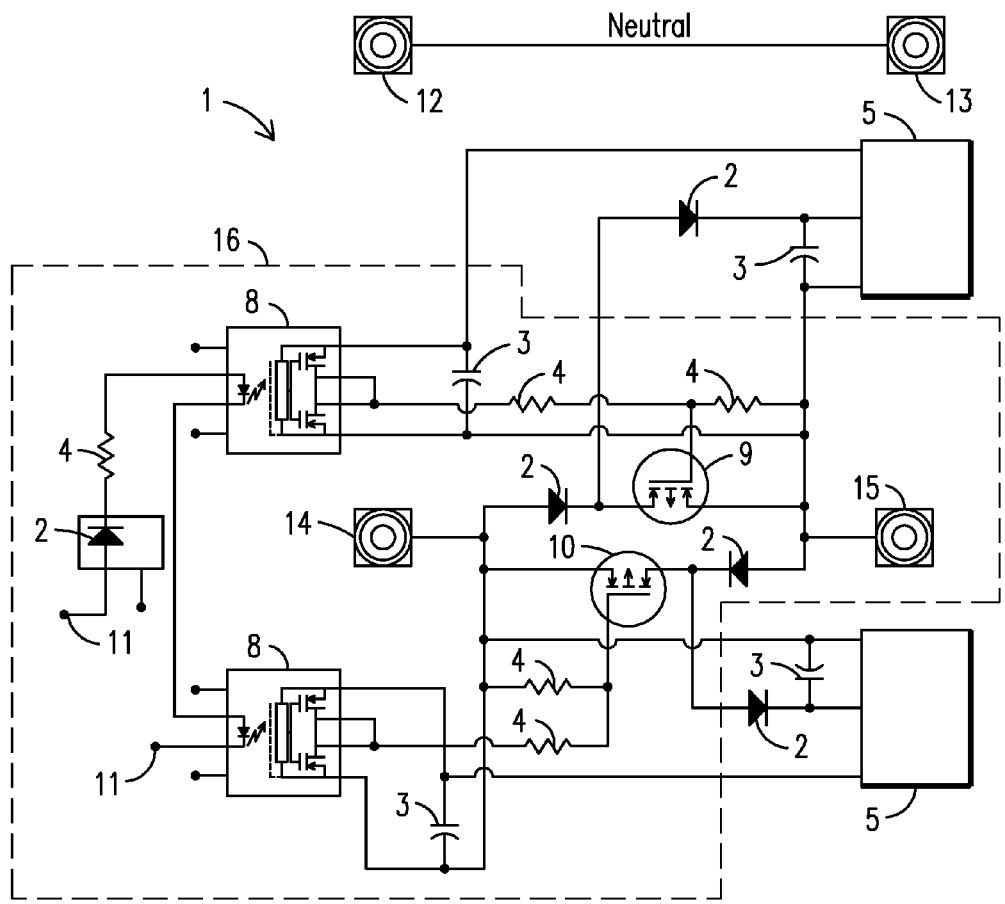
FIG. 1 is a circuit diagram of an IGBT/FET power supply of the present invention connected to an AC voltage controller.

For purposes of describing the preferred embodiment, the terminology used in reference to the numbered components in the drawings is as follows:

| | |
|---|---|
| 1. | IGBT/FET power supply, generally |
| 2. | diode |
| 3. | capacitor |
| 4. | resistor |
| 5. | power supply unit |
| 6. | power supply unit switcher |
| 7. | inductor |
| 8. | optically-isolated driver |
| 9. | positive half cycle control transistor |
| 10. | negative half cycle control transistor |
| 11. | drive command signal input |
| 12. | line in neutral main power connector |
| 13. | line out neutral main power connector |
| 14. | line in main power connector |
| 15. | line out main power connector |
| 16. | voltage controller |

With reference to FIG. 1, a circuit diagram of an IGBT/FET power supply 1 of the present invention connected to an AC voltage controller 16 is shown. The IGBT/FET power supply, generally 1, includes a plurality of diodes 2, capacitors 3 and at least one power supply unit 5. The IGBT/FET power supply 1, as shown, is connected to a standard AC voltage controller 16 having at least one resistor 4 and at least one optically-isolated driver 8 connected in either series or parallel connection to at least one drive command signal 11 so as to supply DC power to operate IGBT and/or FET drivers (not shown). A positive half cycle control transistor 9 is in connection with a diode 2 and a negative half cycle control transistor 10 is in connection with a diode 2 as shown. The diodes 2 steer unidirectional pulses of power obtained during the period that the IGBT or FET driver is off. When the IGBT or FET driver is off, the IGBT or FET driver has input AC voltage across its line in main power connector 14 and line out main power connector 15. Power enters the circuit between the line in neutral main power connector 12 and the line in main power connector 14 and exits the circuit between the line out neutral main power connector 13 and the line out main power connector 15. When utilizing an IGBT driver, the line in main power connector 14 is connected to a diode 2 and an emitter and the line out main power connector 15 is connected to a diode 2 and a collector. When utilizing a FET driver, however, the line in main power connector 15 is connected to a diode 2 and a source and the line out main power connector 15 is connected to a diode 2 and a drain.

The diodes 2 route the power pulses to the capacitors 3 and, since the capacitors 3 are referenced to the drive command signal input 11, no separate, expensive isolation components are necessary. The DC voltage across the capacitors 3 are independent and correctly referenced to the emitter (in the case of the IGBT) and to the source (in the case of the FET) and are a a DC voltage dependent upon the incoming line voltage. This "floating" DC voltage is applied to at least one power supply unit 5 employing small, inexpensive "off line" power supply unit switchers 6, which are described in detail below.

Although one particular schematic of a voltage controller 16 is shown, voltage controllers 16 having differing circuitry may also be utilized.

Figure 2:
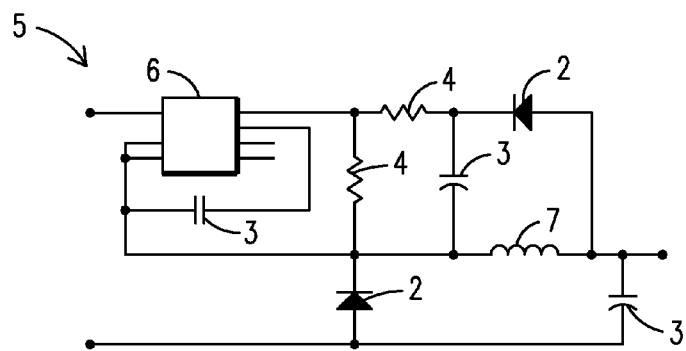
FIG. 2 is a circuit diagram of a power supply unit of the IGBT/FET power supply of the present invention.

With reference to FIG. 2, a circuit diagram of a power supply unit of the IGBT/FET power supply of the present invention is shown. The power supply unit 5, which includes at least one power supply unit switcher 6, provides regulated DC drive voltage, preferably +18V DC or to such voltage demanded by the IGBT or FET drivers or compatible with the enhancement specification of the IBGT or FET drivers utilized, to the IGBT or FET driver(s). The power supply unit 5 includes diodes 2, capacitors 3 and resistors 4 in accordance to the circuit diagram of FIG. 2. In addition, an inductor 7 is provided in the circuit.

It is to be understood that while a preferred embodiment of the invention is illustrated, it is not to be limited to the specific form or arrangement of parts herein described and shown. It will be apparent to those skilled in the art that various changes may be made without departing from the scope of the invention and the invention is not be considered limited to what is shown and described in the specification and drawings.

Having thus described my invention, I claim:

1. A power supply configured for providing DC voltage to IGBT drivers, comprising:
   an AC voltage controller having a line in main power connector, a line out main power connector and a drive command signal input configured for connection to an IGBT driver;
   a first power supply unit in connection with said voltage controller and configured to provide a first DC voltage to said IGBT driver;
   a first capacitor in connection with said drive command signal input and said first power supply unit; and
   a first diode configured for routing a pulse of power from said voltage controller to said first capacitor when said IGBT driver is in an off condition;
   wherein said line in main AC power connector is configured for connection to an emitter of said IGBT driver and for receiving an AC current;
   wherein said line out main AC power connector is configured for connection to a collector of said IGBT driver and for allowing said AC current to exit;
   wherein said line in main power connector and said line our main power connector are configured for having an AC voltage across them when said IGBT driver is in an off condition; and
   wherein said first capacitor is configured to have a second DC voltage across said first capacitor that is applied to said first power supply unit when said AC current is received in said line in main power connector.

2. The power supply of claim 1 wherein:
   said first diode is configured to route said pulse of power from said voltage controller to said first power supply unit.

3. The power supply of claim 1 wherein:
   said first power supply unit has a power supply unit switcher.

4. The power supply of claim 2 wherein:
   said first power supply unit has a power supply unit switcher.

5. A power supply configured for providing DC voltage to FET drivers, comprising:
   an AC voltage controller having a line in main power connector, a line out main power connector and a drive command signal input configured for connection to an FET driver;
   a first power supply unit in connection with said voltage controller and configured to provide a first DC voltage to said FET driver;
   a first capacitor in connection with said drive command signal input and said first power supply unit; and
   a first diode configured for routing a pulse of power from said voltage controller to said first capacitor when said FET driver is in an off condition;
   wherein said line in main power connector is configured for connection to a source of said FET driver and for receiving an AC current;

wherein said line out main power connector is configured for connection to a drain of said FET driver and for allowing said AC current to exit;

wherein said line in main power connector and said line our main power connector are configured for having an AC voltage across them when said FET driver is in an off condition; and wherein said first capacitor is configured to have a second DC voltage across said first capacitor that is applied to said first power supply unit when said AC current is received in said line in main power connector.

6. The power supply of claim 5 wherein:
said first power supply unit has a power supply unit switcher.

7. A power supply system for providing DC voltage to IGBT drivers, comprising:
an IGBT driver comprising an emitter and a collector;
an AC voltage controller having a line in main power connector, a line out main power connector and a drive command signal input connected to said IGBT driver;
a first power supply unit in connection with said voltage controller and configured to provide a first DC voltage to said IGBT driver;
a first capacitor in connection with said drive command signal input and said first power supply unit; and
a first diode configured for routing a pulse of power from said voltage controller to said first capacitor and to said first power supply unit when said IGBT driver is in an off condition;
wherein said line in main power connector is connected to said emitter and configured for receiving an AC current;
wherein said line out main power connector is connected to said collector and configured for allowing said AC current to exit;
wherein said line in main power connector and said line our main power connector are configured for having an AC voltage across them when said IGBT driver is in an off condition; and
wherein said first capacitor is configured to have a second DC voltage across said first capacitor that is applied to said first power supply unit when said AC current is received in said line in main power connector.

8. The power supply system of claim 7 wherein:
said first power supply unit has a power supply unit switcher.

9. A power supply system for providing DC voltage to FET drivers, comprising:
an FET driver comprising a source and a drain;
an AC voltage controller having a line in main power connector, a line out main power connector and a drive command signal input connected to said FET driver;
a first power supply unit in connection with said voltage controller and configured to provide a DC voltage to said FET driver;
a first capacitor in connection with said drive command signal input and said first power supply unit; and
a first diode configured for routing a pulse of power from said voltage controller to said first capacitor and to said first power supply unit when said FET driver is in an off condition;
wherein said line in main power connector is connected to said source and configured for receiving an AC current;
wherein said line out main power connector is connected to said drain and configured for allowing said AC current to exit;

wherein said line in main power connector and said line our main power connector are configured for having an AC voltage across them when said IGBT driver is in an off condition; and wherein said first capacitor is configured to have a second DC voltage across said first capacitor that is applied to said first power supply unit when said AC current is received in said line in main power connector.

10. The power supply system of claim 9 wherein:
said first power supply unit has a power supply unit switcher.

11. The power supply of claim 1,
wherein said first capacitor is referenced to said drive command signal input; and
wherein said second DC voltage across said first capacitor is referenced to said emitter and dependent upon said AC current.

12. The power supply of claim 11,
wherein said voltage controller further comprises a positive half cycle control transistor and a negative half cycle control transistor;
wherein said positive half cycle control transistor is in connection with said first diode and said negative half cycle control transistor is in connection with a second diode.

13. The power supply of claim 5,
wherein said first capacitor is referenced to said drive command signal input; and
wherein said second DC voltage across said first capacitor is referenced to said emitter and dependent upon said AC current.

14. The power supply of claim 13,
wherein said voltage controller further comprises a positive half cycle control transistor and a negative half cycle control transistor;
wherein said positive half cycle control transistor is in connection with said first diode and said negative half cycle control transistor is in connection with a second diode.

15. The power supply of claim 7,
wherein said first capacitor is referenced to said drive command signal input; and
wherein said second DC voltage across said first capacitor is referenced to said emitter and dependent upon said AC current.

16. The power supply of claim 15,
wherein said voltage controller further comprises a positive half cycle control transistor and a negative half cycle control transistor;
wherein said positive half cycle control transistor is in connection with said first diode and said negative half cycle control transistor is in connection with a second diode.

17. The power supply system of claim 9, further comprising:
a second power supply unit in connection with said voltage controller and configured to provide said first DC voltage to said FET driver;
a second capacitor in connection with said drive command signal input and said second power supply unit; and
a second diode configured for routing said pulse of power from said voltage controller to said second capacitor and to said second power supply unit;
wherein said second capacitor is configured to have said second DC voltage across said second capacitor that is applied to said second power supply unit when said AC current is received in said line in main power connector.

18. The power supply system of claim 17,
wherein said first capacitor and said second capacitor are referenced to said drive command signal input; and
wherein said second DC voltage across said first capacitor and said second capacitor is referenced to said source and dependent upon said AC current.

19. The power supply of claim 18,
wherein said voltage controller further comprises a positive half cycle control transistor and a negative half cycle control transistor;
wherein said positive half cycle control transistor is in connection with said first diode and said negative half cycle control transistor is in connection with said second diode.

20. The power supply of claim 19,
wherein said first power supply unit comprises a power supply unit switcher, two diodes, two capacitors, two resistors, and an inductor.

\* \* \* \* \*